US012663770B2

(12) United States Patent
Reeb et al.

(10) Patent No.: US 12,663,770 B2
(45) Date of Patent: Jun. 23, 2026

(54) METHOD FOR VALIDATING OR VERIFYING A TECHNICAL SYSTEM

(71) Applicant: Robert Bosch GmbH, Stuttgart (DE)

(72) Inventors: David Reeb, Renningen (DE); Kanil Patel, Stuttgart (DE); Karim Said Mahmoud Barsim, Stuttgart (DE); Melih Kandemir, Agedrup (DK); Sebastian Gerwinn, Leonberg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 459 days.

(21) Appl. No.: 18/164,419

(22) Filed: Feb. 3, 2023

(65) Prior Publication Data

US 2023/0280705 A1    Sep. 7, 2023

(30) Foreign Application Priority Data

Mar. 2, 2022    (EP) .................................... 22159748

(51) Int. Cl.
*G05B 17/02* (2006.01)
*G06F 30/20* (2020.01)

(52) U.S. Cl.
CPC ............. *G05B 17/02* (2013.01); *G06F 30/20* (2020.01)

(58) Field of Classification Search
CPC .......... G05B 13/04; G05B 17/02; G06F 30/20
See application file for complete search history.

(56) References Cited

U.S. PATENT DOCUMENTS

2012/0150499 A1* 6/2012 Todorov .................. G06F 30/20
703/2

2014/0278472 A1* 9/2014 Guetz .................... G16H 50/30
705/2
2017/0352205 A1* 12/2017 Lacaille ............... G05B 23/024
2021/0173011 A1* 6/2021 Kajbaf .................... G06F 30/27

FOREIGN PATENT DOCUMENTS

CN        112305938 A    2/2021
WO      WO-0101206 A2 *  1/2001   ............. G05B 17/02

OTHER PUBLICATIONS

Shalev-Shwartz et al., "On a Formal Model of Safe and Scalable Self-Driving Cars," Cornell University, 2018, pp. 1-37. <https://arxiv.org/pdf/1708.06374.pdf> Downloaded Feb. 3, 2023.
Danquah et al., "Statistical Validation Framework for Automotive Vehicle Simulations Using Uncertainty Learning," Applied Sciences, MDPI (Multidisciplinary Digital Publishing Institute), 2021, pp. 1-22. <https://www.mdpi.com/2076-3417/11/5/1983> Downloaded Feb. 3, 2023.

* cited by examiner

*Primary Examiner* — Tameem D Siddiquee
(74) *Attorney, Agent, or Firm* — NORTON ROSE FULBRIGHT US LLP

(57)        ABSTRACT

A computer-implemented method for verifying and/or validating whether a technical system fulfills a desired criterion with a predefined probability. The technical system emits output signals based on input signals supplied to the technical system. The method includes: obtaining models for components of the technical system and connections between the models; obtaining test outputs for the models based on test inputs of the models and the connections between the models; determining an upper or lower bound of an output of the technical system; verifying and/or validating whether the technical system fulfills the criterion with the predefined probability based on the determined upper or lower bound of the output.

13 Claims, 3 Drawing Sheets

METHOD FOR VALIDATING OR VERIFYING A TECHNICAL SYSTEM

CROSS REFERENCE

The present application claims the benefit under 35 U.S.C. § 119 of European Patent Application No. EP 22 15 9748.7 filed on Mar. 2, 2022, which is expressly incorporated herein by reference in its entirety.

FIELD

The present invention relates to a computer-implemented method for validating or verifying a technical system, a computer program, and a machine-readable storage medium.

BACKGROUND INFORMATION

Shalev-Shwartz et al. 2018, "On a Formal Model of Safe and Scalable Self-driving Cars", https://arxiv.org/pdf/1708.06374.pdf describes a mathematical model for safety assurance.

Danquah et al. 2021, "Statistical Validation Framework for Automotive Vehicle Simulations Using Uncertainty Learning", https://doi.org/10.3390/app11051983 describes a statistical validation framework for dynamic systems with changing parameter configurations.

A technical system comprises components, wherein the system can be understood to define interactions and/or interrelations between the components. For example, a control system of a robot such as an autonomous vehicle typically comprises components for sensing an environment of the robot, for planning actions of the robot in such an environment and for determining control signals to actuators of the robot to execute the planned actions.

Modern technical systems typically comprise a considerable amount of components which in turn can make it very hard to predict the behavior of such a system. Given the aforementioned example, the components for sensing the environment may make mistakes in the sensing process, e.g., miss objects in the environment, the planning components may be faced with a sensed environment for which no suitable actions are known in the planning components or there may be discrepancies between the planned actions and the actions actually carried out by the robot.

In general, it is very hard to verify and/or validate that a technical system exhibits a desired behavior in its environment, let alone guarantee such a desired behavior. A main reason for this is that the components comprised by the system may in themselves exhibit unknown and/or stochastic behavior and/or may be so complex that they can only be treated as black boxes. For example, modern environment perception components of robots typically rely on methods from the field of machine learning, in particular deep learning methods, for sensing an environment. Such methods are inherently statistical, and their complexity typically does not allow for a straightforward approach for determining the exact behavior of the perception system.

Even beyond that, components of a system themselves may be systems, i.e., the system may actually be a system of systems. In such systems of systems, complexity grows quite rapidly which in turn makes it very hard to accurately predict the behavior of such a system of systems, i.e., verify and/or validate that the system behaves as required or desired.

Advantageously, the proposed invention allows for verifying and/or validating a technical system even if the technical system is complex, e.g., even if the technical system comprises a plurality of components that are intricately linked together.

SUMMARY

In a first aspect, the present invention concerns a computer-implemented method for determining a probability for a technical system to fulfill a desired criterion, wherein the technical system output signals based on input signals supplied to the technical system. According to an example embodiment of the present invention, the method comprises the steps of:

Obtaining models for components comprised by the technical system and obtaining connections between the models for the components, wherein a connection characterizes which model passes which output as input to another model;

Obtaining a plurality of validation measurements, wherein a validation measurement comprises a measurement input and a measurement output, wherein the measurement output is obtained from a component of the technical system for the measurement input if the measurement input is provided to the component;

Obtaining test outputs for the models based on test inputs of the models and the connections between the models;

Determining an upper bound of an output of the technical system or a lower bound of the output by propagating upper or lower bounds of discrepancies of the models through the models, wherein a discrepancy of a model characterizes a discrepancy between a distribution of measurement outputs for a component and a distribution of test outputs obtained for the model of the component;

Verifying and/or validating whether the technical system fulfills the criterion with the predefined probability based on the determined upper bound of the output or verifying and/or validating whether the technical system fulfills the criterion with the predefined probability based on the determined lower bound of the output.

In general, the purpose of a method for verifying and/or validating a technical system may be understood as aiding a user of the method in determining a probability of the technical system to fulfill the desired criterion. The determined probability could then be compared to a probability threshold and the technical system could be considered as verified and/or validated with respect to the criterion if the probability of fulfilling the desired criterion is equal to or above the probability threshold. If the determined probability does not reach or exceed the probability threshold, the criterion can be considered to not be able to be verified or not be able to be validated. For example, the technical system could be a mobile robot and the criterion could be phrased as "the robot does not deviate from a desired path of the robot by more than 50 cm". The method would then allow for statistically assessing a probability of the criterion to be fulfilled.

Alternatively, the method could also be used to determine a probability for violating the desired criterion. In this case, the criterion could be considered to be verified and/or validated of the determined probability is equal to or below the probability threshold.

Advantageously, the inventors found that the determined probability is a guaranteed lower bound on the probability of the criterion to be fulfilled (or vice versa a guaranteed upper bound on the probability of the criterion being violated). This allows for giving a definitive answer about a characteristic of the technical system, i.e., allows for a deep understanding of the technical system which in turn allows to correctly operate the technical system.

In some example embodiments of the present invention, the desired criterion may be a requirement or a plurality of requirements with respect to some specification, e.g., design specification or legal specification. For example, it may be a requirement for a powertrain (i.e., the technical system) of a vehicle comprising an internal combustion engine to only produce a specified amount of emission particles (e.g., the number of NOx particles has to be below a predefined threshold) for a predefined time of operation. In this particular case, the method may aid a validation engineer to determine a probability for whether the powertrain to actually operate in accordance with the specified amount of emissions.

The probability threshold may be chosen in accordance with a specification of the system. Alternatively, the probability threshold may also be given by or derived from legal stipulations.

In general, the method may be used for any system comprising components or sub-systems. For all such systems, the method allows for a guided process. As verification and/or validation is typically an integral building block with respect to releasing a system under development, the system may for example be released if the criterion is verified and/or validated to be fulfilled. Alternatively, the method may be used to verify and/or validate multiple criteria and the system may be released if all criteria are verified and/or validated to be fulfilled. Alternatively, the method may be a part of a larger test strategy for assessing whether the system may be released. In all embodiments discussed above, the system may for example not be released if a criterion or multiple criteria cannot be verified and/or validated. In such cases, components of the technical system may be improved, and the method may be run again after improvement of the components in order to verify and/or validate the improved system with respect to the criterion or the criteria. For example, in the embodiment from above, the engine may be limited in its power in order to reduce the amount of emitted particles and/or components of the powertrain may be exchanged for more efficient components with respect to the emitted particles.

In other words, the method can be understood as a human-machine guided process for assessing whether a certain criterion can be expected to be fulfilled when using the system in the real world.

The technical system interacts with the real world by means of determining the output signal based on an input signal. In the exemplary embodiment of the present invention from above, the powertrain may for example be equipped with sensors for measuring a temperature of an environment of the powertrain and may control the engine and/or parts of an after-treatment of exhaust gas, e.g., a catalyst, accordingly. However, the input signals to the system do not necessarily need to be input into the technical system by means of a sensor or communication device. The input signals may, for example, also characterize environment conditions of the technical system that have an influence on the operation of the technical system. For example, the amount of emissions produced by an internal combustion engine typically depends on a temperature of the environment of the internal combustion engine. In such an embodiment, the temperature could be considered an input signal of the technical system even though the engine does not receive temperature information by means of a sensor or communication device. In other words, the temperature has a physical impact on the engine without the engine measuring the temperature. The input signal may hence also be understood as an input stimulus.

The different components of the technical system may hence be connected by means of an exchange of information through, e.g., signals (e.g., measurement data, control signals) and/or by means of physical interaction (e.g., processing of exhaust gas).

Generally, a technical system as described in according to the present invention may be quite complex, e.g., in the way components of the technical system interact with each other and/or complex with respect to the individual components of the technical system, which may make it very hard to accurately assess the behavior of the technical system with respect to different environment situations and such different input signals of the technical system. With conventional methods, the only way to assess the behavior of such a technical system is typically to treat the technical system as a black box with respect to its input-output behavior, run the technical system in the real world to collect data about the input-output behavior and use statistical methods to deduct information about the input-output behavior. This may also be understood as gathering data to predict an input-output behavior of the technical system. However, the main drawback of such approaches is that typically a large amount of data needs to be collected in order to accurately assess the input-output behavior. Especially for safety critical systems and/or technical systems that are bound to some form of legal provision with respect to its input-output behavior (e.g., only a maximum number of allowed emitted particles over a certain time of operation) collecting such data to accurately predict the input-output behavior requires an excessive test or validation campaign which often times is infeasible due to the vast amount of data necessary to collect.

Advantageously, the method according to an example embodiment of the present invention allows for vastly reducing the actual amount of real-world data that needs to be collected while still being able to give approximate guarantees concerning an input-output behavior of the technical system. In particular, the method allows for verification and/or validation of a technical system without the need for end-to-end data (black box), but rather only component-level data; thus, verification and/or validation may be performed during the design of the technical system, even before the full technical system has been assembled.

From an abstract point of view, the method may be understood in so far as that a model of the technical system is constructed by means of modelling the different components of the technical system through different models and then being able to simulate the behavior of the technical system by means of the model. Advantageously, the model of the technical system (e.g., the combination of the different models of the components of the technical system) is linked to the technical system such that a notion of difference between outputs of the model and outputs of the technical system may be determined. Based on this notion of difference, a probabilistic guarantee for the behavior of the technical system itself may be given, even if the data used for determining outputs of the model is based on simulations.

According to an example embodiment of the present invention, in a first step, models for the components of the technical system are obtained. A model may be physical models. In the example from above, the engine of the powertrain (the powertrain being the technical system, the engine being a component of the technical system) may be modelled by a physical model of the engine. Alternatively, a model may be given by the component itself. For example, an engine controller may be an algorithm instantiated by a piece of software. The software itself may be used directly as model. Alternatively, it is also possible that a model is a statistical model, e.g., a machine learning model such as a neural network.

Advantageously, a modelling granularity may be chosen at the user's discretion. That is, the detail of the models may be chosen at the user's discretion. For example, the user may determine whether to model the component of an engine as a single model or to apply a fine-grained modelling, e.g., by modelling fuel injection behavior, combustion behavior, and/or mechanical properties of parts of the engine such as the pistons, the valves, and the crankshaft.

In other words, the method is agnostic to the level of modelling (coarse grained, fine grained or anything in between) of the components.

According to an example embodiment of the present invention, in a second step, validation measurements are obtained for the components of the technical system. In the context of the method, validation measurements are understood as pairs of an input measurement and an output measurement, wherein an output measurement is obtained if a component is provided the input measurement. In other words, output measurements are linked to components. An output measurement of a first component may be provided as input measurement to a second component. A measurement input of the technical system may also be used as input measurement to one or multiple components of the technical system. Advantageously, the validation measurement for each component of the technical system may be obtained by running and measuring the respective component in isolation, e.g., on a test bench. If the overall technical system is already assembled and/or available to be run, the validation measurements may also be obtained by running one or multiple test runs (sometimes also referred to as validation runs) of the technical system in the real world and measuring the respective input measurements and output measurements of each component.

According to an example embodiment of the present invention, in a third step, test inputs for the individual models are obtained. Using the test inputs for the models, the models are used to determine test outputs, wherein a test output is determined by running a model for a test input. Preferably, this may be achieved by forwarding possible inputs to the technical system, e.g., obtained by simulation, through the chain of models and determining test inputs and test outputs for each model in the chain of models.

The pairs of test inputs and test outputs may be considered counterparts to measurement inputs and measurements inputs. Where measurement inputs and measurement outputs are linked to the components of the technical system, test inputs and test outputs are linked to the models of the components. Test inputs and test outputs may especially be obtained by simulation, e.g., by synthesizing possible inputs to the technical system and forwarding these synthesized inputs through the models in order to determine the test inputs and test outputs. Advantageously, this allows for simulating the behavior of the technical system all the while being able to determine how close the simulation results are to the behavior of the technical system in the real-world. In other words, the user is given a statistical guarantee about the behavior of the technical system based on the simulation results.

In the method according to an example embodiment of the present invention, this is achieved by comparing distributions of outputs of the components to distributions of outputs of the models. The comparison may especially be based on a measure of discrepancy between probability distributions. The method is able to determine its guarantees based on an upper bound of how far an output distribution of the technical system deviates from an output distribution obtained from the models of the technical system. A discrepancy of a model may be understood as characterizing a discrepancy between a distribution of measurement outputs obtained for a component and a distribution of test outputs obtained for the model of the component. In other words, the inventors found that discrepancies regarding individual components can be propagated through the model of the technical system, wherein the model of the technical system is characterized by comprising the models of the components as well as their connections, i.e., which model provides input to which other model. By being able to propagate the discrepancies, the method is able to determine an upper bound of the output of the technical system or a lower bound of the output of the technical system. This upper bound or lower bound may then be used for the verification and/or validation task.

A discrepancy (also referred to as discrepancy measure) between two distributions may be understood as a function that maps the two probability distributions (defined on the same space) to a real number. A discrepancy may be understood as quantifying how close a first probability distribution is to a second probability distribution although technically, this does not need to be the case. In particular, a discrepancy does not need to be positively oriented, does not need to be positive definite, does not need to be symmetric and/or does not need satisfy the triangle inequality.

Examples of functions used to determine a discrepancy are:

the maximum mean discrepancy (MMD)—or its square—between the distributions with respect to a kernel function on the underlying space of the distributions;

the cosine similarity with respect to a kernel function on the underlying space of the distributions;

the Wasserstein distance with respect to a distance measure on the underlying space of the distributions;

a norm distance between the two distributions coming from any norm, such as the total-variation norm;

f-divergences such as the Kullback-Leibler divergence, Renyi divergences, or similar measures;

affine combinations or any real-valued functions of any such discrepancy measures;

relaxations and approximations of any such discrepancy measures.

Preferably, a function is used as discrepancy measure that carries a notion of distance in the underlying space of the distributions, such as the Wasserstein distance or kernel-based measures where the kernel carries such a notion of distance (e.g., via length scales or via an intermediate embedding).

Preferably, it is possible to use relaxations and approximations of such discrepancy measures (which are again discrepancy measures). Preferably, the discrepancy can be relaxed or formulated to yield a convex or a concave function. This is advantageous as determining an upper bound or a lower bound of the output of the technical system can be obtained through an optimization problem and the arising optimization can then be solved by a convex solver. Using a convex solver can lead to a decrease in time necessary for optimization.

Preferably, the distributions are modelled as weighted empirical distributions. That is, given a component and its corresponding model, each measurement input, measurement output, test input, and test output of the component or the model respectively may be assigned a weight. The weights on the measurement inputs and measurement outputs may be understood as allowing for constructing distributions out of the measurement inputs which are close enough to the test input distributions and to construct distributions out of the measurement outputs which are worst-case in the sense of achieving the desired criterion.

In preferred embodiments of the present invention, the upper bounds of discrepancies of the models are propagated through the models by iteratively determining an upper bound of discrepancy for a second model, wherein the discrepancy is determined based on a discrepancy for a first model and wherein the first model provides an input to the second model.

Preferably a discrepancy for the second model is determined according to a first formula:

$$B^{c+1} := \max_{\alpha} D\big(S^{c+1}[p_\alpha], q^{c+1}\big)$$

$$\text{subject to } D(p_\alpha, q^c) \le B^c$$

$$\alpha_i \ge 0 \forall\ i = 1, \dots, I$$

$$\sum_i \alpha_i = 1,$$

where $p_\alpha$ characterizes a weighted empirical probability distribution $$p_\alpha = \{(\alpha_i, x_i^c)\}_{i=1}^I$$

of measurement inputs $$x_i^c$$

for a component c of the technical system, wherein the component with index c corresponds to the second model and each measurement input is assigned a weight $\alpha_i$, $B^{c+1}$ is the upper bound of the discrepancy for the second model, D is a discrepancy measure, $S^{c+1}[p_\alpha]$ is a weighted distribution of measurement outputs obtained for a component with index c+1 (the component corresponding with the second model) when using the weights $\alpha_i$, $q^{c+1}$ is a distribution of test outputs for the second model, $q^c$ is a distribution of test outputs for the first model and $B^c$ is a discrepancy determined for the first model.

As can be seen from the first formula, the discrepancy can be determined for each model based on a discrepancy determined for a "previous" model, wherein an order of models is determined by which model provides input to which other model. For example, the first model provides input to the second model and hence precedes the second model. It is also possible to have multiple first models provide input to a second model. In this case, the first formula from above would acquire a constraint according to the first constraint as displayed in the first formula for each model that provides input to the second model.

The distribution $p_\alpha$ may be understood as distribution of measurement inputs for the second model and the distribution $s^{c+1}[p_\alpha]$ as distribution of measurement outputs, wherein a weight for an element in the measurement output is the same as the weight for the measurement input used to determine the measurement output.

For a model that processes an input of the technical system or synthesized input directly, a constraint regarding a distribution of the inputs or synthesized inputs may be provided as starting point for propagating the upper bounds of discrepancies through the models. This constraint may, for example, characterize a worst-case deviation that can be assumed between data occurring in the real world and synthesized data used for determining the test outputs of the models.

The first formula from above may also be used for models that use the synthesized data as inputs, i.e., models that are no preceded by another model. In such cases, $p_\alpha$ may be understood as distribution of measurement inputs obtained for a component that corresponds to a model that is not preceded by another model, i.e., an input component of the technical system, $q^c$ may be understood as a distribution of test inputs for the model corresponding to the component, e.g., a distribution of synthesized data, and $B^c$ may be understood as a maximal deviation between the distribution of measurement inputs of the input component and a distribution of test inputs of the model corresponding to the input component. In this case, $B^c$ may be understood as an a priori expected worst-case deviation between the data occurring in the real world and the data used for determining output from the models, e.g., synthesized data. While the a priori expected worst-case deviation may be provided to the method as an external parameter, it is also possible to estimate $B^0$ from data. For example, $B^0$ could be estimated from the measurement inputs of the input component and the test inputs for the model corresponding to the input component. Preferably, this can be achieved by determining a discrepancy between the distribution of measurement inputs and the distribution of measurement outputs using a discrepancy measure such as MMD or the square of the MMD. For this, the weights of the respective distributions may be chosen to be uniform. Alternatively, it is also possible to estimate $B^0$ based on possible inputs of the real world that have not been used as measurement inputs or are not used as measurement inputs. For example, validation runs could be executed to only gather possible inputs of the system without recording the individual measurement outputs of the components. In this case, the possible inputs could be used instead of the measurement inputs in the aforementioned approach to determine $B^0$.

In general, an optimization problem according to the first formula may not be a convex optimization problem. Preferably, it is possible to use a transformed discrepancy measure, leading to the optimization problem being able to being relaxed to a convex (and possibly even semidefinite) optimization problem.

Preferably, the quadratic maximum mean discrepancy is used as discrepancy measure, wherein the quadratic maximum mean discrepancy measure may be determined according to a second formula:

$$MMD(p, q)^2 = \|p - q\|_k^2$$
$$:= \sum_{i,i'=1}^{I} \alpha_i \alpha_{i'} k(x_i, x_{i'}) + \sum_{j,j'=1}^{J} \gamma_j \gamma_{j'} k(z_j, z_{j'}) - 2 \sum_{i,j=1}^{I,J} \alpha_i \gamma_j k(x_i, z_j)$$

wherein $$p = \{(x_i, \alpha_i)\}_{i=1}^{I}$$

is an empirical distribution over points $x_i$ with weights $\alpha_i$ (satisfying $a_i \geq 0$ and $\Sigma_i \alpha_i = 1$), $$q = \{(z_j, \gamma_j)\}_{j=1}^{J}$$

is an empirical distribution over points $z_j$ with weights $\gamma_j$ (satisfying $\gamma_j \geq 0$ and $\Sigma_j \gamma_j = 1$), p and q are defined on a same space, and k is a kernel on this space.

The inventors found that a relaxation of the optimization problem according to the first formula can be characterized by a third formula:

$$B_{relaxed}^{c+1} = \max_{A} Tr[E_{out} A]$$

subject to $Tr[E_{in} A] \leq B^c$ $$\begin{pmatrix} A & A1 \\ 1^T A & 1 \end{pmatrix} \geq 0$$

$$1^T A 1 = 1$$

$$A \geqslant 0$$

wherein $A \in \mathbb{R}^{V \times V}$ is a symmetric matrix to optimize, $E_{out}$ is a $V \times V$ matrix that arises by writing $MMD(S^{c+1}[p_\alpha]q^{c+1})^2$ according to the second formula, $E_{in}$ is a $V \times V$ matrix that arises by writing $MMD(p_\alpha, q^c)^2$ according to the second formula and $1 \in \mathbb{R}^{V}$ is a V-dimensional vector with all entries 1, where V denotes the number of measurement inputs (and thus also measurement outputs) for the component with index c, and where the inequality sign "$\geq$" in the second constraint denotes positive-semi definiteness of matrices, and the inequality sign "$\geqslant$" in the last constraint requires all matrix entries to be non-negative. Surprisingly, the authors found that the relaxation is typically exact, i.e., optimizing the relaxed problem gives the same upper bound as optimizing the unrelaxed problem. This is advantageous as this way the upper bound of the model corresponding to the output component is not unnecessarily pessimistic, i.e., is tight. A tight bound leads to a more accurate probability determined by the method and in turn allows for a better understanding of the technical system. For example, a loose bound could potentially lead to the determined probability for violating the desired criterion being too high (or conversely the determined probability for achieving the desired criterion too low). This would potentially trigger the system to be scheduled for improvement, wherein this improvement is unnecessary as the criterion could already be verified and/or validated if not for the inaccurately determined probability due to the loose bound.

By iteratively or recursively determining the upper bounds for the respective models, the user finally arrives at an upper bound for a model corresponding to an output component of the technical system, i.e., a component that provides an output signal of the technical system, an output information of the technical system, or an output action of the technical system. In the example of the powertrain from above, the output may for example characterize an amount of emitted particles of the technical system, wherein the output component is a measuring device for determining the emitted particles from an exhaust component of the powertrain.

Having obtained this upper bound for the output component, one can then determine the probability for the desired criterion to be fulfilled. For example, an output of the system (i.e., a sample from $p^C$) may be characterized by a real value and the criterion may state a threshold $\theta$ that the value shall not exceed. A lower bound on the probability for fulfilling this criterion can be obtained by determining the result of an optimization problem characterized by the formula:

$$V_{min} := \min_{p:\, D(p, q^C) \leq B^C} \int_{-\infty}^{\theta} p(e) de,$$

wherein $V_{min}$ is the probability. An upper bound on the probability for violating the criterion can be obtained by using $\theta$ as lower bound and $\infty$ as upper bound for the integral and replacing minimization with maximization. The optimization in the preceding formula extends over all probability distributions p on the output space (e.g. the space of emission values e), which satisfy the stated constraint that they do not deviate from the simulation output distribution $q^C$ by more than the previously computed upper bound $B^C$.

In other example embodiments of the present invention, the criterion may state a threshold that the output shall not fall under. A lower bound on the probability for fulfilling this criterion can be obtained by determining the result of an optimization problem characterized by the formula:

$$V_{min} := \min_{p:\, D(p, q^C) \leq B^C} \int_{\theta}^{\infty} p(e) de.$$

The probability for violating this criterion can be obtained by using $-\infty$ as lower bound and $\theta$ as upper bound of the integral and replacing the minimization by maximization.

In preferred embodiments of the present invention, it is also possible that an output of the technical system is assessed by a validation target function with respect to the desired criterion. The validation target function may be understood as a function $V : y \rightarrow \mathbb{R}$ that maps any output y of the output component of the technical system to a real valued quantity. Preferably, $V(y) \in [0,1]$ can be the probability of y violating the desired criterion. As an example, $V(y) = \mathbb{1}_{y \notin spec}$ indicates whether y violates some specification spec; particularly when $y \in \mathbb{R}$ is real-valued, $V(y) = \mathbb{1}_{y > \theta}$ can indicate whether an output y exceeds some given threshold $\theta$ (such as an emission threshold). This is the example from above. Alternatively, it is also possible that $V(y) \in \mathbb{R}$ can be a summary of a more complex output y, such as, e.g., the accumulated tailpipe emissions $V(y)$ from a timeseries y of instantaneous emissions. In this case, the method delivers an upper bound on the average tailpipe emissions over typical trips.

A specification may be understood as synonymous with a desired criterion.

In the context of the method, a maximum of the validation target function or a minimum of the validation target function can be understood to serve as means for determining if the system can be verified and/or validated with respect to the criterion or not.

This may preferably be achieved by solving an optimization problem according to a fourth formula:

$$V_{max} := \max_{p:\, D(p^C, q^C) \le B^C} \int V(y)\, dp(y).$$

$V_{max}$ indicates an upper bound on the average value of the validation target function V. $V_{max}$ may then be compared to a desired accepted threshold value $V_{threshold}$ and the technical system may be considered to be verified and/or validated with respect to the specification if the $V_{max}$ does not exceed the predefined threshold $V_{threshold}$ (i.e., the desired criterion).

In order to make the optimization computationally feasible, $V_{max}$ may preferably be determined by quantizing the space of the output of the output component, e.g., by equidistant points or a general grid, assigning to each point (or each point in the grid) a weight and solving an optimization problem similar to the one for determining the upper bounds of the models. The optimization can hence be determined according to the formula:

$$V_{max} := \max_{\alpha} \sum_g \alpha_g V(y_g)$$

$$\text{subject to } D(p_\alpha, q^C) \le B^C$$

$$\alpha_g \ge 0 \,\forall\, g = 1, \dots, G$$

$$\sum_g \alpha_g = 1$$

where $p_\alpha$ denotes a weighted empirical distribution over points (or points in the grid). In any one of the aforementioned embodiments, it is possible that a model is improved if the criterion cannot be verified and/or validated.

$V_{max}$ may then be used as a statistical guarantee regarding the desired criterion. For example, using the example of the powertrain, the output may be an emission count such as number of NOx particles emitted from the powertrain and $V_{max}$ may then indicate that the amount.

Failing to be able to verify and/or validate the criterion may hinge on simply the models being used in the method to be too inaccurate in order to allow for a tight enough bound on the output of the model modelling the output component. A loose bound may result in failing to meet the criterion, wherein failure to meet the criterion may simply stem from the inaccuracy of one or multiple models with respect to their respective components, which may result in too pessimistic of a bound on the output. Thus, one or multiple models may advantageously be improved upon, i.e., they may be adapted to reflect the behavior of their respective component more accurately. This may be achieved by using a respective discrepancy of a model as loss function and optimizing the model such that the discrepancy is decreased. If the model is differentiable, this may be achieved by means of a gradient descent algorithm.

Alternatively or for models that are not differentiable, evolutionary algorithms may be used for optimization.

Advantageously, an improvement of the model leads to a tighter bound of the model corresponding to the output component and thus a more accurate assessment of the criterion. Assessing this improvement should preferably be done using measurement data (i.e., measurement inputs and measurement outputs) that were not used for improving the models as this could otherwise lead to overfitting and/or information leakage.

In any one of the aforementioned embodiments of the present invention, it is further possible that components of the technical system are improved if the criterion cannot be verified and/or validated.

This may be understood as determining that the technical system cannot or is likely to not being able to accomplish the desired criterion and thus has to be improved in order to meet the desired criterion. Using the example from the powertrain, improving upon a component may for example include reducing a power of the engine in order to consume less fuel and thus emit less particles and/or replace a catalyst of the powertrain in order to filter out more emitted particles.

Example embodiments of the present invention will be discussed with reference to the following figures in more detail.

DETAILED DESCRIPTION OF EXAMPLE EMBODIMENTS

Figure 1:
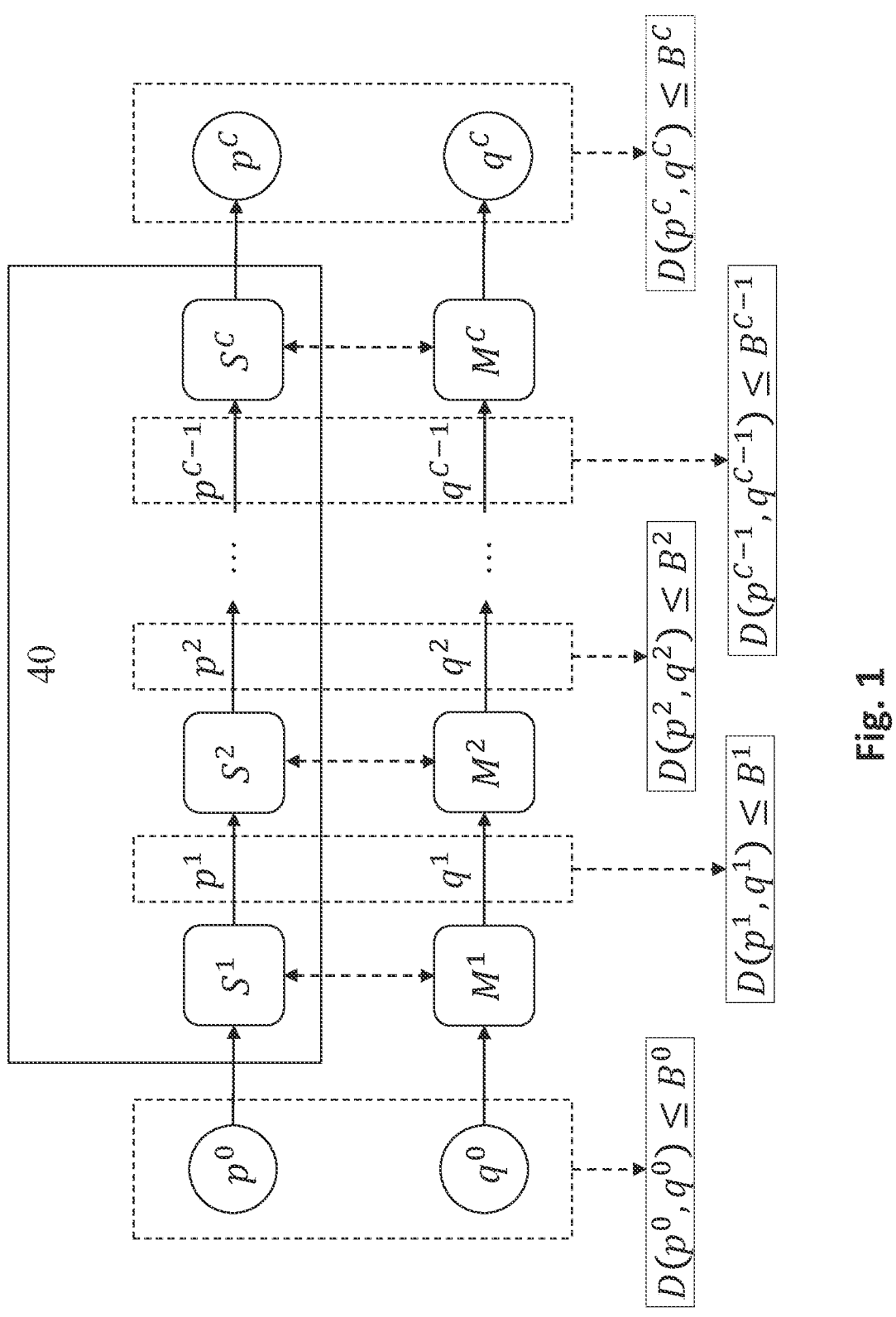
FIG. 1 shows a control system, according to an example embodiment of the present invention.

FIG. 1 exemplarily shows how a technical system (40) comprising a plurality of components $(S^1, S^2, C^C)$ can be verified and/or validated. The control system (40) may be understood as an embodiment of the technical system referred to herein. For each component a respective model $(M^1, M^2, M^C)$ is provided. A model $(M^1, M^2, M^C)$ has a one-to-one correspondence with a component $(S^1, S^2, C^C)$ indicated by a dashed arrow.

The control system (40) comprises an input component $(S^1)$, which is configured to accept input from a sensor. The sensor may preferably be part of the control system (40). The sensor provides input measurements to the input component. The input measurements (input signals) can be understood to follow a distribution $(p^0)$, wherein the distribution $(p^0)$ may preferably be modelled by a weighted empirical distribution. Samples for building the weighted empirical distribution can be determined by running a validation run to gather input signals. The weighted empirical distribution may then be characterized by a formula:

$$p^0 = \left\{ \left( \alpha_\nu^0, x_\nu^0 \right) \right\}_{\nu=1}^V$$

wherein $$\alpha_v^0$$

is a weight, $$x_v^0$$

is an input signal and V is the number of input signals.

The control system (40) is configured to determine an output or an action based on the input measurement. For this, an input measurement is forwarded through the components. Each component thus receives an input that is based on an input measurement but has been processed by a component of the control system (40) (unless the component is the input component). For example, the input component (S$^1$) receives the input measurement, determines some output from the input measurement and forwards the determined output to another component (S$^2$) of the control system (40). In turn, the other component (S$^2$) processes the input provided to the other component (S$^2$) and forwards its output to yet another component (not shown).

According to this chain, each component (S$^1$,S$^2$,C$^C$) receives an input (also referred to as measurement input) and provides an output (also referred to as measurement output). An output of a component (S$^1$,S$^2$,C$^C$) may be understood to follow some distribution (p$^1$,p$^2$,p$^{C-1}$, p$^C$) which can preferably be modelled by a weighted empirical distribution. Such a weighted empirical distribution may be characterized by the formula:

$$p^c = \{(\alpha_v^c, x_v^c)\}_{v=1}^V$$

wherein $$\alpha_v^c$$

is a weight, $$x_v^c$$

is a measurement output and the superscript c indicates an affiliation to a specific component (S$^1$,S$^2$,C$^C$). For example, the measurement output $$x_v^2$$

is a measurement output for a second component (S$^2$) based on an input measurement $$x_v^1,$$

wherein the measurement output $$x_v^2$$

is determined based on a measurement output $$x_v^1$$

obtained from the input component (S$^1$). The measurement output $$x_v^1$$

may also be understood as a measurement input to the second component (S$^2$).

For each component there exists a model (M$^1$,M$^2$,M$^C$). The models are linked according to the linking of the components (S$^1$,S$^2$,S$^C$) they correspond to. An input model (M$^1$) corresponding to the input component (S$^1$) is provided data from a test dataset, i.e., test inputs. The test inputs may preferably be determined synthetically, e.g., based on a synthesis model that is configured to model input measurements for the control system (40). The synthesis model may preferably be a model from the field of machine learning, e.g., a generative model such as a generative adversarial network.

According to the modelling chain, each model (M$^1$,M$^2$, M$^C$) receives an input (also referred to as test input) and provides and output (also referred to as test output). An output of a model (M$^1$,M$^2$,M$^C$) may be understood to follow some distribution (q$^1$,q$^2$,q$^{C-1}$, q$^C$) which can preferably be modelled by a weighted empirical distribution. Such a weighted empirical distribution may be characterized by the formula:

$$q^c = \{(\gamma_w^c, z_w^c)\}_{w=1}^W$$

wherein $$\gamma_w^c$$

is a weight, $$z_w^c$$

is a test output and the superscript c indicates an affiliation to a specific model (M$^1$,M$^2$,M$^C$). For example, the test output $$z_w^2$$

is a test output for a second model (M$^2$), wherein the test output $$z_w^2$$

is determined by processing a test output $$z_w^1$$

obtained from another model ($M^1$). The test output $$x_v^1$$

may also be understood as a test input to the second model ($M^2$). The dataset of test data can also be understood to follow a weighted empirical distribution $q^0$. Preferably, the empirical distribution $q^0$ uses equal weights for each sample in the distribution.

The output of an output component ($S^C$) of the control system ($40$) may be a signal characterizing an action to be performed and/or characterizing a real number. For example, if the control system ($40$) is configured to determine a control signal of a robot (e.g., an at least partially autonomous vehicle), the output may characterize a high-level action to be performed by the robot (e.g., perform a lane change) or may characterize a numerical value used for controlling the robot (e.g., a steering angle position, an acceleration rate and/or a brake force). The output may be understood as being subject to verification and/or validation by the proposed method with respect to some desired criterion. Using the example of the robot, the criterion may be that any action taken by the robot may not result in the robot deviating more than a predefined allowed distance from a predefined or determined path. In further embodiments (not shown) it is also possible that the output component of the control system ($40$) is a "special" component that is otherwise not used when operating the control system ($40$) but is used for assessing the behavior of the control system ($40$). For example, the output component may be an emission measuring device for determining an amount of particles emitted from a component of the control system ($40$), e.g., in case the control system ($40$) is a powertrain.

There may preferably exist a validation target function that maps outputs of the output component to a real value. The validation target function may be understood as a function $V:y \rightarrow \mathbb{R}$ that maps any output $y$ of the output component of the control system ($40$) to a real valued quantity. Preferably, $V(y) \in [0,1]$ can be the probability of $y$ violating the desired criterion. As an example, $V(y) = \mathbb{1}_{y \notin spec}$ indicates whether $y$ violates some specification spec; particularly when $y \in \mathbb{R}$ is real-valued, $V(y) = \mathbb{1}_{y > \theta}$ can indicate whether an output $y$ exceeds some given threshold $\theta$ (such as an emission threshold). In other words, the method may be understood to determine an upper bound of a probability that a specification is not fulfilled (or the inverse, i.e., a lower bound of a probability that the specification is fulfilled). For determining this upper bound (or lower bound), upper bounds ($B^1, B^2, B^{C-1}, B^C$) of discrepancies (D) may be propagated through the models ($M^1, M^2, M^C$). In particular, a discrepancy (D) may indicate a deviation of a distribution of measurement outputs ($p^1, p^2, p^{C-1}, p^C$) of a component ($S^1, S^2, S^C$) and a distribution of test outputs ($q^1, q^2, q^{C-1}, q^C$) of a model ($M^1, M^2, M^C$) linked to the component. This may be understood as determining a discrepancy (D) between measurement outputs obtained from the component in the real world and test outputs determined for the models. In the embodiment, upper bounds ($B^1, B^2, B^{C-1}, B^C$) of the discrepancies for the respective models ($M^1, M^2, M^C$) are determined according to the third formula:

$$B_{relaxed}^{c+1} = \max_A Tr[E_{out}A]$$

subject to $Tr[E_{in}A] \leq B^c$ $$\begin{pmatrix} A & A1 \\ 1^T A & 1 \end{pmatrix} \geq 0$$

$$1^T A1 = 1$$

$$A \succeq 0.$$

As discrepancy measure (D), the squared MMD may preferably be used. In order to determine a discrepancy (D) for the model ($M^1$) corresponding to the input component, a discrepancy $B^0$ is required. In the embodiment, this is achieved by determining a squared MMD between a uniformly weighted empirical distribution of the input measurements and a uniformly weighted empirical distribution of the (inputs from the) test dataset.

Having obtained the discrepancy for the model corresponding to the output component, an upper bound (or lower bound) for the probability of fulfilling the specification may then be determined.

Figure 2:
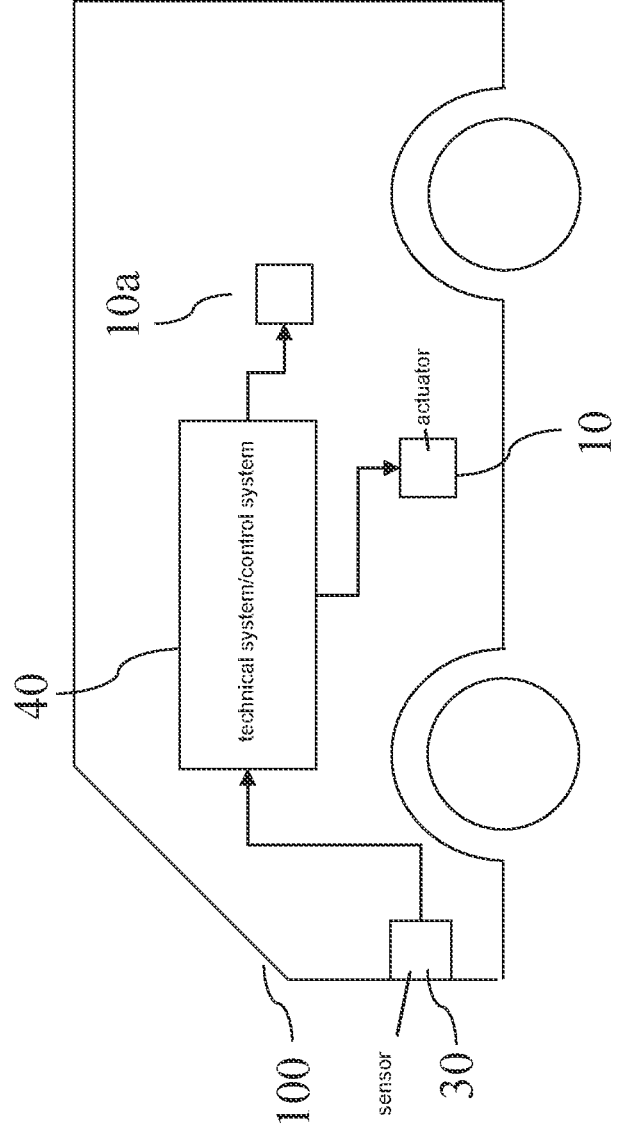
FIG. 2 shows the control system controlling an at least partially autonomous robot, according to an example embodiment of the present invention.

FIG. 2 shows an embodiment in which the control system ($40$) is used to control an at least partially autonomous robot, e.g., an at least partially autonomous vehicle ($100$).

A sensor ($30$) of the vehicle ($100$) may comprise one or more video sensors and/or one or more radar sensors and/or one or more ultrasonic sensors and/or one or more LiDAR sensors. Some or all of these sensors are preferably but not necessarily integrated in the vehicle ($100$). The control system may, for example, be configured to automatically keep the vehicle ($100$) above a predefined distance from other objects in an environment of the vehicle ($100$) or have the vehicle not reduce a time to collision with vehicles in the environment below a predefined threshold. The desired criterion to be validated may, for example, be that the probability of the vehicle ($100$) approaching another vehicle closer than the predefined distance is below a predefined percentage threshold.

The control system ($40$) may preferably comprise an image classifier as a component, e.g., as input component ($S^1$). The image classifier may be configured to detect objects in the vicinity of the at least partially autonomous robot based on input images. A measurement output of the input images may comprise an information, which characterizes where objects are located in the vicinity of the at least partially autonomous robot. A subsequent component may then determine a suitable driving path through the environment such that the predefined distance or the predefined threshold concerning the time to collision is kept to all recognized objects. A control signal may then be determined from an output component of the control system ($40$). The control signal may be used to control an actuator ($10$) of the vehicle ($100$). The control signal may be set to have the vehicle drive in accordance with the driving path.

The actuator ($10$), which is preferably integrated in the vehicle ($100$), may be given by a brake, a propulsion system, an engine, a powertrain, or a steering of the vehicle ($100$).

In further embodiments, the at least partially autonomous robot may be given by another mobile robot (not shown), which may, for example, move by flying, swimming, diving, or stepping. The mobile robot may, inter alia, be an at least partially autonomous lawn mower, or an at least partially autonomous cleaning robot. In all of the above embodiments, the control signal may be determined such that propulsion unit and/or steering and/or brake of the mobile robot are controlled such that the mobile robot may avoid collisions with said identified objects.

In a further embodiment, the at least partially autonomous robot may be given by a gardening robot (not shown), which uses the sensor (30), preferably an optical sensor, to determine a state of plants in the environment (20). The actuator (10) may control a nozzle for spraying liquids and/or a cutting device, e.g., a blade. Depending on an identified species and/or an identified state of the plants, a control signal may be determined to cause the actuator (10) to spray the plants with a suitable quantity of suitable liquids and/or cut the plants.

In even further embodiments, the at least partially autonomous robot may be given by a domestic appliance (not shown), like e.g. a washing machine, a stove, an oven, a microwave, or a dishwasher. The sensor (30), e.g., an optical sensor, may detect a state of an object which is to undergo processing by the household appliance. For example, in the case of the domestic appliance being a washing machine, the sensor (30) may detect a state of the laundry inside the washing machine. The control signal may then be determined depending on a detected material of the laundry.

Figure 3:
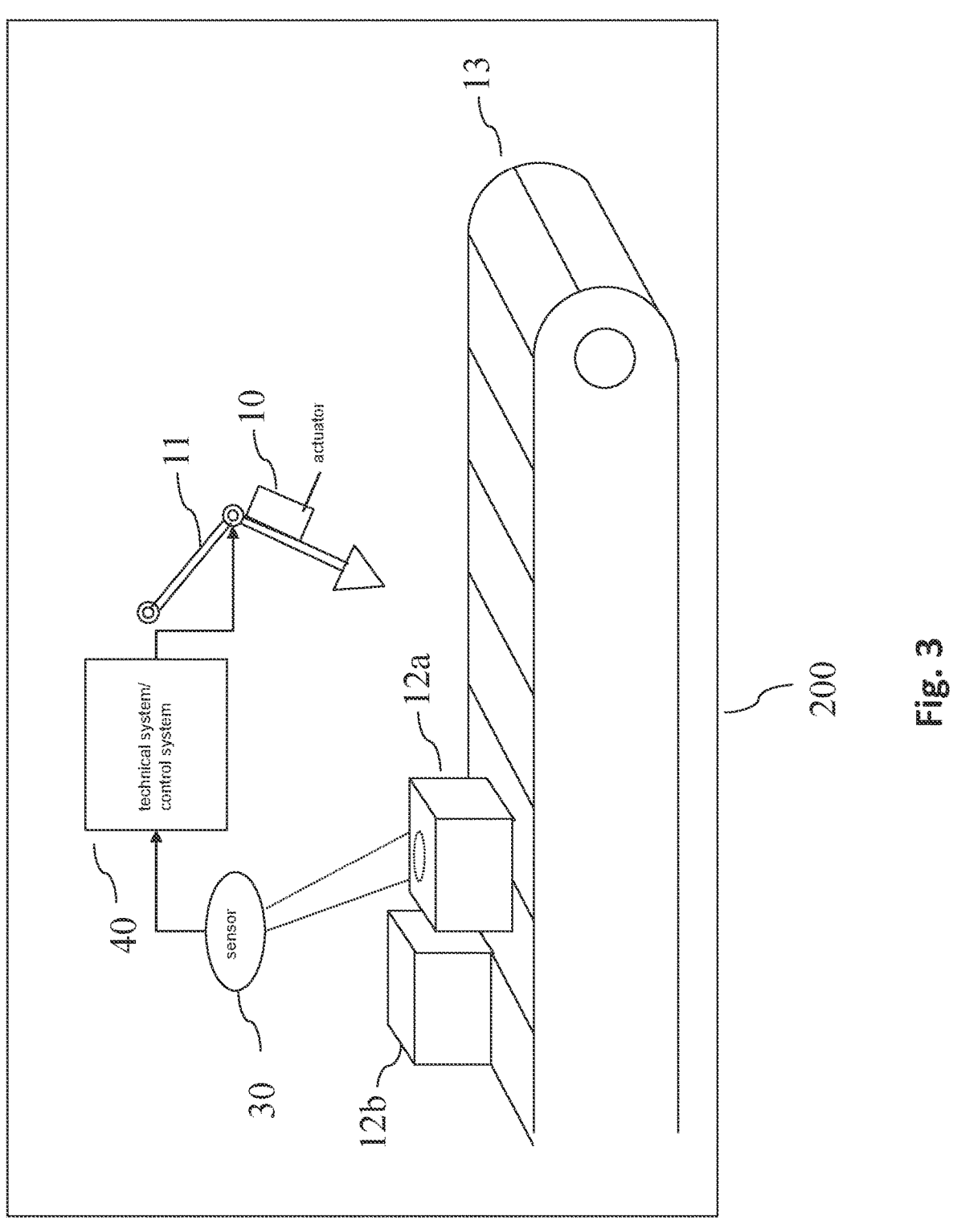
FIG. 3 shows the control system controlling a manufacturing machine, according to an example embodiment of the present invention.

FIG. 3 shows an embodiment in which the control system (40) is used to control a manufacturing machine (11), e.g., a punch cutter, a cutter, a gun drill, a welding robot, or a gripper, of a manufacturing system (200), e.g., as part of a production line. The manufacturing machine (11) may comprise a transportation device, e.g., a conveyer belt or an assembly line, which moves a manufactured product (12). The control system (40) controls an actuator (10), which in turn controls the manufacturing machine (11).

A sensor (30) used for providing input measurements to the control system (40) may be given by an optical sensor which captures properties of, e.g., a manufactured product (12). The control system (40) may comprise an image classifier as input component (S¹).

The image classifier may determine a position of the manufactured product (12) with respect to the transportation device. The actuator (10) may then be controlled depending on the determined position of the manufactured product (12) for a subsequent manufacturing step of the manufactured product (12). For example, the actuator (10) may be controlled to cut or weld the manufactured product along a specific path on the manufactured product (12). In these embodiments, the path may be determined by a component of the control system (40), wherein another component of the control system (40) then determines control signals for the actuator (10) of the manufacturing machine (11). The desired criterion may be that a cut or weld does not deviate from the planned path by more than a predefined threshold.

Alternatively, it may be envisioned that the image classifier classifies, whether the manufactured product is broken or exhibits a defect. The actuator (10) may then be controlled as to remove the manufactured product (12) from the transportation device. In this case, the desired criterion may be that the amount of manufactured products (12) that is wrongfully sorted out (e.g., products that are actually not broken or exhibit a defect but are still sorted out) is below a predefined threshold.

What is claimed is:

1. A computer-implemented method for verifying and/or validating whether a technical system fulfills a desired criterion with a predefined probability, wherein the technical system emits output signals based on input signals supplied to the technical system, the method comprising the following steps:

obtaining models for components ($S^1$, $S^2$, $S^C$) included in the technical system, and obtaining connections between the models for the components ($S^1$, $S^2$, $S^C$), wherein each connection characterizes which model passes which output as input to another model;

obtaining a plurality of validation measurements, wherein each validation measurement includes a measurement input and a measurement output, the measurement output being obtained from a component ($S^1$, $S^2$, $S^C$) of the technical system for the measurement input when the measurement input is provided to the component ($S^1$, $S^2$, $S^C$);

obtaining test outputs for the models based on test inputs of the models and the connections between the models;

determining an upper bound of an output of the technical system or a lower bound of the output by propagating upper or lower bounds ($B^1$, $B^2$, $B^{C-1}$, $B^C$) of discrepancies (D) of the models through the models, wherein each discrepancy (D) of each model characterizes a discrepancy (D) between a distribution of measurement outputs ($p^1$, $p^2$, $p^{C-1}$, $p^C$) for the component ($S^1$, $S^2$, $S^C$) corresponding to the model and a distribution of test outputs ($q^1$, $q^2$, $q^{C-1}$, $q^C$) obtained for the model of the component ($S^1$, $S^2$, $S^C$); and verifying and/or validating whether the technical system fulfills the criterion with the predefined probability based on the determined upper bound of the output or verifying and/or validating whether the technical system fulfills the criterion with the predefined probability based on the determined lower bound of the output.

2. The method according to claim 1, wherein the upper bounds ($B^1$, $B^2$, $B^{C-1}$, $B^C$) of discrepancies (D) of the models are propagated through the models by iteratively determining an upper bound ($B^1$, $B^2$, $B^{C-1}$, $B^C$) of discrepancy (D) for a second model, wherein the discrepancy (D) is determined based on a discrepancy (D) for a first model and wherein the first model provides an input to the second model.

3. The method according to claim 2, wherein the discrepancy (D) for the second model is determined by maximizing the discrepancy (D) between a distribution of measurement outputs obtained for that component which corresponds to the second model and a distribution of test outputs obtained for the second model, wherein the discrepancy is maximized over possible distributions of measurement outputs obtained for that component.

4. The method according to claim 3, wherein the maximization of the discrepancy is a convex optimization problem under convex constraints.

5. The method according to claim 4, wherein the distribution of measurement outputs obtained for the component is a weighted empirical distribution.

6. The method according to claim 5, wherein the discrepancy for the second model is determined according to a first formula:

$$B^{c+1} := \max_\alpha D\big(S^{c+1}[p_\alpha], q^{c+1}\big)$$

19

-continued subject to $D(p_\alpha, q^c) \leq B^c$ $\alpha_v \geq 0 \forall v = 1, \dots, V$ $$\sum_v \alpha_v = 1.$$

7. The method according to claim 6, wherein each discrepancy between each respective distribution of measurements outputs and a respective distribution of test outputs are determined by a weighted sum of kernel evaluations for elements of the respective distributions.

8. The method according to claim 7, wherein the discrepancy for the second model is determined according to a relaxation of the first formula, wherein the relaxation characterizes a convex optimization problem.

9. The method according to claim 1, wherein the test inputs and test outputs are determined by synthesizing inputs of the technical system and forwarding the synthesized inputs through the models.

10. The method according to claim 1, wherein a model of the models is improved when the criterion cannot be verified and/or validated.

11. The method according to claim 1, wherein components of the technical system are improved when the criterion cannot be verified and/or validated with the predefined probability.

12. The method according to claim 1, wherein the technical system is configured to provide a control signal to a manufacturing machine, and/or a robot.

13. A non-transitory machine-readable storage medium on which is stored a computer program for verifying and/or validating whether a technical system fulfills a desired criterion with a predefined probability, wherein the technical system emits output signals based on input signals supplied to the technical system, the computer program, when executed by a computer, causing the computer to perform the following steps:

obtaining models for components ($S^1$, $S^2$, $S^C$) included in the technical system, and obtaining connections between the models for the components ($S^1$, $S^2$, $S^C$), wherein each connection characterizes which model passes which output as input to another model;

obtaining a plurality of validation measurements, wherein each validation measurement includes a measurement input and a measurement output, the measurement output being obtained from a component ($S^1$, $S^2$, $S^C$) of the technical system for the measurement input when the measurement input is provided to the component ($S^1$, $S^2$, $S^C$);

obtaining test outputs for the models based on test inputs of the models and the connections between the models;

determining an upper bound of an output of the technical system or a lower bound of the output by propagating upper or lower bounds ($B^1$, $B^2$, $B^{C-1}$, $B^C$) of discrepancies (D) of the models through the models, wherein each discrepancy (D) of each model ($M^1$, $M^2$, $M^C$) characterizes a discrepancy (D) between a distribution of measurement outputs ($p^1$, $p^2$, $p^{C-1}$, $p^C$) for the component ($S^1$, $S^2$, $S^C$) corresponding to the model and a distribution of test outputs ($q^1$, $q^2$, $q^{C-1}$, $q^C$) obtained for the model ($M^1$, $M^2$, $M^C$) of the component ($S^1$, $S^2$, $S^C$); and verifying and/or validating whether the technical system fulfills the criterion with the predefined probability based on the determined upper bound of the output or verifying and/or validating whether the technical system fulfills the criterion with the predefined probability based on the determined lower bound of the output.

* * * * *